United States Patent
Li et al.

(10) Patent No.: US 11,475,927 B1
(45) Date of Patent: Oct. 18, 2022

(54) STATIC RANDOM-ACCESS MEMORY AND ELECTRONIC DEVICE

(71) Applicant: TSINGHUA UNIVERSITY, Beijing (CN)

(72) Inventors: Xueqing Li, Beijing (CN); Yiming Chen, Beijing (CN); Xiaoyang Ma, Beijing (CN); Mufeng Zhou, Beijing (CN); Yushen Fu, Beijing (CN); Yongpan Liu, Beijing (CN); Huazhong Yang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 17/479,940

(22) Filed: Sep. 20, 2021

(30) Foreign Application Priority Data

May 18, 2021 (CN) .......................... 202110540242.X

(51) Int. Cl.
  *G11C 7/10* (2006.01)
  *G11C 7/12* (2006.01)
  *H03K 19/20* (2006.01)
  *G11C 8/08* (2006.01)

(52) U.S. Cl.
  CPC ............ *G11C 7/1012* (2013.01); *G11C 7/109* (2013.01); *G11C 7/1063* (2013.01); *G11C 7/12* (2013.01); *G11C 8/08* (2013.01); *H03K 19/20* (2013.01)

(58) Field of Classification Search
  CPC ..... G11C 7/1012; G11C 7/1063; G11C 7/109; G11C 7/12; G11C 8/08; H03K 19/20
  USPC .................................................... 365/189.05
  See application file for complete search history.

(56) References Cited

FOREIGN PATENT DOCUMENTS

| CN | 101022035 A | * | 8/2007 | |
|----|----|----|----|----|
| CN | 104882159 A | * | 9/2015 | |
| CN | 112802520 A | * | 5/2021 | ........... G11C 11/413 |

* cited by examiner

*Primary Examiner* — Fernando Hidalgo
(74) *Attorney, Agent, or Firm* — Marshall, Gerstein & Borun LLP

(57) ABSTRACT

The present disclosure relates to a static random-access memory and an electronic device. The memory includes at least one storage circuit, wherein the storage circuit includes a first inverter, a second inverter, a first switch, a second switch, a third switch, a fourth switch, a fifth switch, a word-line, a first bit-line, a second bit-line, a shift-input line, and a shift-output line. The circuit is used to access data by using the first bit-line and/or the second bit-line when it works in a first mode, and the circuit is used to shift the input data to the shift-input line and output the shifted data through the shift-output line when it works in a second mode. By implementing shift-input and shift-output within the memory, the disclosed embodiment can achieve high-concurrency data access and data update, and it also enables high integration and low power consumption.

20 Claims, 8 Drawing Sheets

STATIC RANDOM-ACCESS MEMORY AND ELECTRONIC DEVICE

CROSS-REFERENCE TO RELATED APPLICATION

This application claims the priority to Chinese Application No. 202110540242.X, filed on May 18, 2021, the content of which is incorporated herein by reference in entirety.

FIELD

The present invention relates to memory technique, and more particularly to a kind of static random-access memory (SRAM) and computing device for bit-serial computational operations.

BACKGROUND

The access to SRAM is one of the bottlenecks that restrict the performance of a computer, which hinders the development of data-intensive applications such as emerging neural networks. Related general-purpose SRAM uses the read-modify-write method row-by-row, which causes high latency and power consumption in the large amount and frequent data moving. The row-by-row operation of related SRAM needs to read and write back repeatedly, bringing frequent bit-line charges. That is to say, the word-line driver is used to charge the corresponding row, the two bit-lines precharge the corresponding column, and then sense amplifiers (SA) are used to sense the voltage difference to complete the read operation. The updated results are calculated by using digital arithmetic logic units (ALUs). The two bit-lines are precharged with power supply voltage and zero voltage (i.e., ground) to drive the corresponding column according to the different write bits, and then the word-line driver is used to drive the corresponding row to complete the update operation. The related technique is limited by the influence of bit-line charging and sense amplifier. Read and write using bit-lines to charge and discharge can only be carried out once in each cycle. Therefore, it is difficult to handle high concurrent update requests. If the related general-purpose SRAM wants to improve parallelism, it can only be realized by increasing the number of arrays, which will bring serious overhead to the peripheral circuit.

SUMMARY

The present disclosure aims to deal with high concurrent update requests.

To this purpose, the present disclosure proposes a static random-access memory. It includes at least one storage circuit, which includes: a first inverter, a second inverter, a first switch, a second switch, a third switch, a fourth switch, a fifth switch, a word-line, a first bit-line, a second bit-line, a shift-input line, and a shift-output line, wherein:

the first switch is used to control the connection between the shift-input line and the input port of the first inverter;

the second switch is used to control the connection between the output port of the first inverter and the input port of the second inverter; the third switch is used to control the connection between the input port of the first inverter and the output port of the second inverter;

the fourth switch and the fifth switch are used to control the connection between the first bit-line and the input port of the first inverter, and the connection between the second bit-line and the input port of the second inverter, respectively according to the input of the word-line.

Wherein, when the circuit works in a first mode, the circuit is used to access data using the first bit-line and the second bit-line. Or, when the circuit works in a second mode, the circuit is used to shift the input data to the shift-input line, and output the shifted data through the shift-output line.

In an embodiment of the present disclosure, the circuit is operated in the first mode when the first switch is turned off, while the fourth switch and the fifth switch are turned on.

In an embodiment of the present disclosure, the circuit is used to store data when the second switch and the third switch are turned on.

In an embodiment of the present disclosure, the circuit is used to write data according to the state of the first bit-line and/or the second bit-line when both the second switch and the third switch are turned off.

In an embodiment of the present disclosure, the memory also includes:

a control module connected to the first switch, the second switch, the third switch, the first bit-line, the second bit-line and the word-line for controlling the conduction states of the first switch, the second switch and the third switch, and the states of the first bit-line, the second bit-line, and the word-line, thus operating the circuit in the first mode or the second mode.

Further, in an embodiment of the present disclosure, the control module is used to operate the circuit in the first mode by the following operation:

in a first writing period, the first switch is controlled to be in the off state, and the first bit-line and the second bit-line are configured in a high-level state or a low-level state according to the data to be written;

in a second writing period, the word-line is configured in a high-level state to turn on the fourth switch and the fifth switch, and turn off the second switch and the third switch;

in a third writing period, the word-line is configured in a low-level state to turn off the fourth switch and the fifth switch, and sequentially turn on the second switch and the third switch.

Further, in an embodiment of the present disclosure, the control module is used to operate the circuit in the second mode by the following operation:

in a first shift period, the fourth switch and the fifth switch are controlled to be in the off state, and the first switch is turned on, while the second switch and the third switch are turned off;

in a second shift period, the first switch is turned off, the second switch is turned on, and the third switch remains in the off state;

in a third shift period, the third switch is turned on, the first switch remains in the off state, and the second switch remains in the on state.

In an embodiment of the present disclosure, the memory includes at least one storage circuit array. Each row of the storage circuit array includes M storage circuits, and each column includes N storage circuits, wherein:

the first bit-lines of multiple storage circuits in the same column are connected, and the second bit-lines of multiple storage circuits in the same column are connected;

the shift-output line of the k-th storage circuit of the multiple storage circuits in the same row is connected to the shift-input line of the adjacent (k+1)-th storage circuit;

the word-lines of multiple storage circuits in the same row are connected;

the control ports of the first switches, the second switches, and the third switches of multiple storage circuits in the same row are respectively connected;

where k, N, and M are integers. k+1≤M.

In an embodiment of the present disclosure, a single-bit algorithm logic unit is included at the end of one or more rows of storage circuits of the storage circuit array for performing multi-bit operations.

Wherein, in the second mode, the single-bit arithmetic logic unit is used for progressive operation according to the shift output of the connected storage circuit, the corresponding bit of preset operands, and a carry output of a previous time, until each bit of the preset operands is executed once.

In an embodiment of the present disclosure, the preset operation includes any one of a logical NOT operation, a logical AND operation, and a logical OR operation;

the single-bit arithmetic logic unit is a Mealy machine;

the preset operation bit comes from an external device or another memory connected with the memory;

when performing multi-bit operations, the single-bit arithmetic logic unit performs operations from the least significant bit to the most significant bit of the preset operands. The output of the single-bit arithmetic logic unit is used as the shift input of the front of the current row.

The present embodiment enables the memory to work in the first mode for data access and the second mode for data shifting by utilizing the loop characteristics of the first inverter and the second inverter. It can achieve high-concurrency data access and data update by implementing shift-input and shift-output within the memory, and it also enables high integration and low power consumption.

Other features and aspects of the present disclosure will become apparent by consideration of the detailed description and accompanying drawings.

BRIEF DESCRIPTION OF THE DRAWINGS

The above and/or additional aspects and advantages of the present disclosure will become apparent and more readily appreciated from the following descriptions made for embodiments with reference to the accompanying drawings, in which.

DETAILED DESCRIPTION

Figure 1:
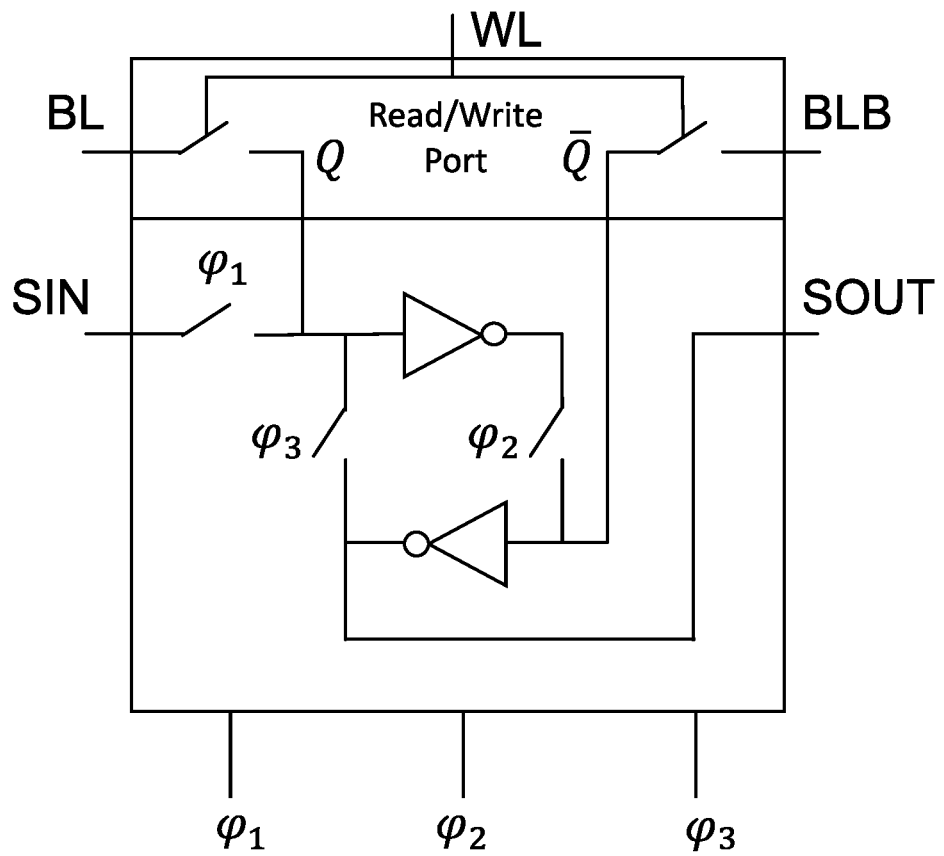
FIG. 1 is a circuit diagram of a static random-access memory according to an embodiment of the present disclosure.

Embodiments of the present disclosure are described in detail below. Examples of embodiments are illustrated in the accompanying drawings, in which, the same or similar numbers represent the same or similar elements or elements with the same or similar functions. Although various aspects of the embodiments are shown in the drawings, it is not necessary to draw the drawings to scale unless otherwise noted.

In the description of the present disclosure, it should be understood that the orientation or positional relationship indicated by the terms: "length", "width", "up", "down", "front", "back", "left", "right", "vertical", "horizontal", "top", "bottom", "inside", "outside", etc. is based on the orientation or positional relationship shown in the drawings, and is only for the convenience of describing the present disclosure and simplifying the description, rather than indicating or implying that the device or element must have a specific orientation, be constructed and operated in a specific orientation, and therefore cannot be understood as a limitation of the present disclosure.

In addition, the terms "first", "second", and "third", etc. are used for descriptive purposes only and cannot be understood as indicating or implying relative importance or implicitly indicating the number of technical features indicated. Thus, the features defined with "first" and "second" can explicitly or implicitly include one or more of the features. In the description of the present disclosure, "multiple" means two or more than two, unless otherwise specifically defined.

In the present disclosure, unless otherwise specified and defined, the terms "installation", "connection", and "fixation", etc. shall be understood in a broad sense. For example, they can refer to fixed connection, detachable connection, or integration; they can be mechanical connection or electrical connection; they can be directly connected, indirectly connected through intermediate media, inner communication inside two elements, or interaction between two elements. For those of ordinary skill in the art, the specific meanings of the above terms in the present disclosure can be understood according to specific contexts.

The special term "exemplary" here refers to "being used as an example, an embodiment, or an illustration". Any embodiment described herein as "exemplary" should not be interpreted as superior or better than other embodiments.

In addition, for better illustration of the present disclosure, numerous specific details are given in the following specific embodiments. It should be understood by those skilled in the art that the present disclosure may also be implemented without certain specific details. In some examples, methods, means, elements, and circuits familiar to those skilled in the art are not described in detail so as to highlight the subject matter of the present disclosure.

Many operations need to update the cache in some applications, such as training and inference in deep neural networks. Limited by device variations and array sizes, forward propagation, backpropagation, and gradient descent require a significant number of parallel shift-and-add operations to perform full-precision multiply-accumulate operations, weight updates require many parallel addition operations, and other applications such as database applications require operations of high concurrency. There are also high demands for power consumption and integration in these applications. The static random-access memory (SRAM) according to embodiments of the present disclosure can realize data-access and shift operations to perform calculations in applications such as deep neural networks, databases, etc., with high concurrency, high integration, and low power consumption.

Please refer to FIG. 1, which is a circuit diagram of a static random-access memory according to an embodiment of the present disclosure.

The memory includes at least one storage circuit, as shown in FIG. 1, the storage circuit may include: a first inverter M1, a second inverter M2, a first switch S1, a second switch S2, a third switch S3, a fourth switch S4, a fifth switch S5, a word-line WL, a first bit-line BL, a second bit-line BLB, a shift-input line Sin and a shift-output line Sout, wherein:

the first switch S1 is used to control the connection between the shift-input line Sin and the input port of the first inverter M1;

the second switch S2 is used to control the connection between the output port of the first inverter M1 and the input port of the second inverter M2; the third switch S3 is used to control the connection between the input port of the first inverter M1 and the output port of the second inverter M2;

the fourth switch S4 is used to control the connection between the first bit-line BL and the input port of the first inverter M1, and the fifth switch S5 is used to control the connection between the second bit-line BLB and the input port of the second inverter M2, respectively according to the input of the word-line WL.

Wherein, when the circuit works in a first mode, the circuit is used to access data using the first bit-line BL and/or the second bit-line BLB;

when the circuit works in a second mode, the circuit is used to shift the data from the shift-input line named Sin and output the shifted data through the shift-output line named Sout.

The static random-access memory of the embodiment of the present disclosure utilizes the loop characteristics of the first inverter and the second inverter to work in the first mode for data access and work in the second mode for data shift. It can achieve high-concurrency data access and data update by implementing shift-input and shift-output within the memory, and it also enables high integration and low power consumption.

The static random-access memory of the embodiment of the present disclosure can be applied to high concurrent read and update scenarios, such as deep neural network (DNN) operation scenarios, databases, and other scenarios.

The static random-access memory of the embodiment of the present disclosure may use the output of the first inverter M1 as the storage state, or use the output of the second inverter M2 as the storage state, and no limitation is made in this respect in the embodiment of the present disclosure. The embodiment of the present disclosure uses a dual-inverter circuit to form a stable loop and maintain the charge without refreshing, thus improving the efficiency of data accesses and updates.

In an embodiment, when reading the SRAM, two bit-lines BL and BLB may be precharged to a read voltage, and the fourth switch S4 and the fifth switch S5 may be turned on. The charges on the two bit-lines rise and fall respectively, according to different storage states. The read state can be determined (for example, through a sense amplifier) to obtain the stored information.

In an embodiment, when writing the SRAM, two bit-lines BL and BLB may be precharged to a write voltage and a ground voltage respectively, according to different writing states, and the fourth switch S4 and the fifth switch S5 may be turned on to enable charging or discharging at corresponding inverter inputs, thus modify the state stored in the SRAM.

In a possible implementation, the switches of embodiments of the present disclosure may be metal-oxide-semiconductor field-effect transistors (MOSFETs), insulated-gate bipolar transistors (IGBTs), or other types of transistors.

In an embodiment, the first switch S1 can be a complementary metal-oxide-semiconductor (CMOS) gate. The second switch S2, the third switch S3, the fourth switch S4, and the fifth switch S5 can be CMOS, n-type metal-oxide-semiconductor (NMOS), or p-type metal-oxide-semiconductor (PMOS) gates, or other forms of switching circuits, and no limitation is made in this respect in the embodiment of the present disclosure.

It should be noted that the static random-access memory of embodiments of the present disclosure can also be other cell structures, such as 6-transistor cell structure, 8-transistor cell structure, and 10-transistor cell structure. Any SRAM cell structure with a dual-inverter circuit and stores information by charge can be used to implement the storage circuit with the in-memory shift function proposed in embodiments of the present disclosure.

The following is an example of a specific implementation of each mode of the SRAM.

In a possible implementation, the circuit works in the first mode when the first switch S1 is off, while the fourth switch S4 and the fifth switch S5 are on.

In a possible implementation, the circuit works in the second mode when the second switch S2 and the third switch S3 are on, and the circuit may be used for data storing.

In a possible implementation, when the second switch S2 and the third switch S3 are off, the circuit is used to write data according to the state of the first bit-line BL and/or the state of the second bit-line BLB.

In an embodiment of the present disclosure, when the SRAM is performing a write operation, the writing speed may be improved by turning off the second switch S2 and the third switch S3 and opening the dual-inverter loop. After the writing operation is completed, the second switch S2 and the third switch S3 are closed to reform the dual inverter loop.

Figure 2A:
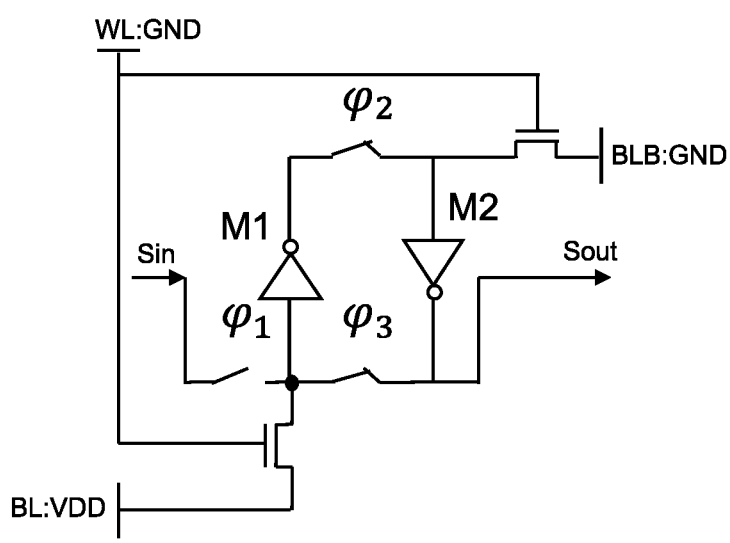
FIG. 2a is a circuit diagram illustrating various periods of data writing in a memory according to an embodiment of the present disclosure.
Figure 2B:
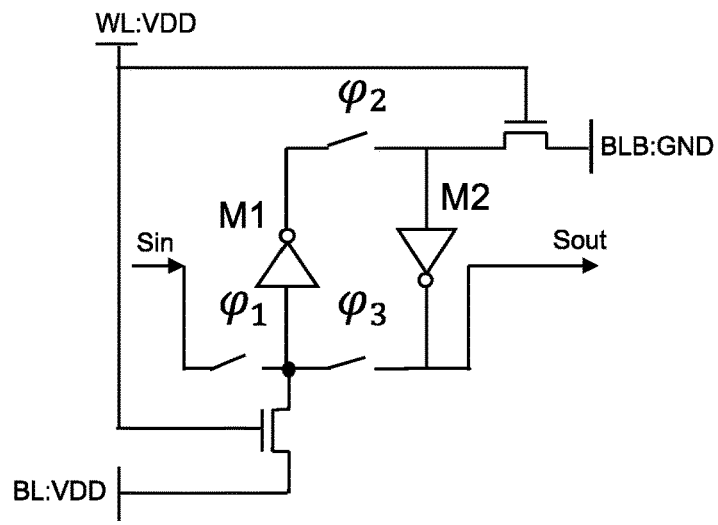
FIG. 2b is a circuit diagram illustrating various periods of data writing in a memory according to an embodiment of the present disclosure.
Figure 2C:
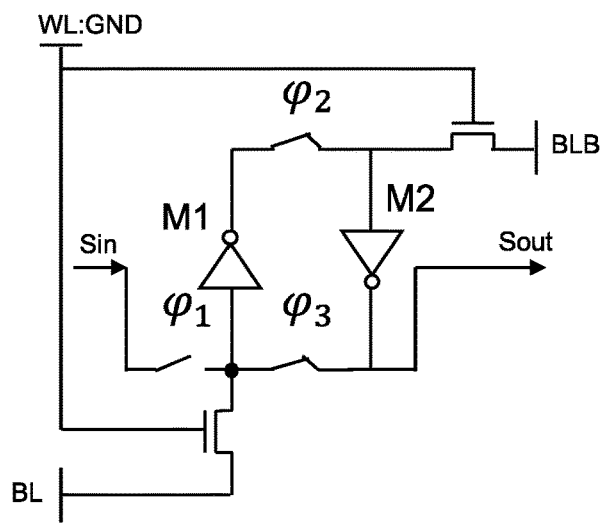
FIG. 2c is a circuit diagram illustrating various periods of data writing in a memory according to an embodiment of the present disclosure.

Please refer to FIGS. 2a, 2b, and 2c, which are circuit diagrams illustrating various periods of data writing in a memory according to an embodiment of the present disclosure.

In an embodiment, the circuit is used to access data when it works in the first mode. In this case, the output states of the two inverters (M1, M2) of the circuit are dual (i.e., one inverter outputs "0" and the other inverter outputs "1").

In a possible embodiment, the memory may further include:

a control module connected to the first switch S1, the second switch S2, the third switch S3, the first bit-line BL, the second bit-line BLB and the word-line WL for controlling the conduction state of the first switch S1, the second switch S2 and the third switch S3, and the states of the first bit-line BL, the second bit-line BLB and the word-line WL, thus operating the circuit in the first mode or the second mod.

In an embodiment, the control module may include a processing component that comprises, but is not limited to, a separated processor, or discrete elements, or a combination of a processor and discrete elements. The processor may include a controller with instruction execution function in an electronic device, and the processor may be implemented in any appropriate way, for example, by one or more application-specific integrated circuits (ASICs), digital signal processors (DSPs), digital signal processing devices (DSPDs), programmable logic devices (PLDs), field-programmable gate arrays (FPGAs), controllers, microcontrollers, or other electronic elements. Within the processor, the executable instructions may be executed through hardware circuits such as logic gates, switches, application-specific integrated circuits (ASIC), programmable logic controllers, and embedded microcontrollers.

In an embodiment, the control module can output a first switch control signal φ1 to control the conduction state of the first switch S1, a second switch control signal φ2 to control the conduction state of the second switch S2, and a third switch control signal φ3 to control the conduction state of the third switch S3.

In a possible implementation, the control module is used to operate the circuit in the first mode for data writing by the following operation:

in an embodiment, shown as FIG. 2a, in a first writing period, the first switch S1 is controlled to be in the off state, and the first bit-line BL and the second bit-line BLB are configured in a high-level state or a low-level state according to the data to be written;

in an embodiment, shown as FIG. 2b, in a second writing period, the word-line WL is configured in a high-level state to turn on the fourth switch S4 and the fifth switch S5, and turn off the second switch S2 and the third switch S3;

in an embodiment, shown as FIG. 2c, in a third writing period, the word-line WL is configured in a low-level state to turn off the fourth switch S4 and the fifth switch S5, and sequentially turn on the second switch S2 and the third switch S3.

In an embodiment, after the third writing period, the SRAM is effectively written to "1" or "0" if the first bit-line BL is in a high-level state or a low-level state.

Figure 3A:
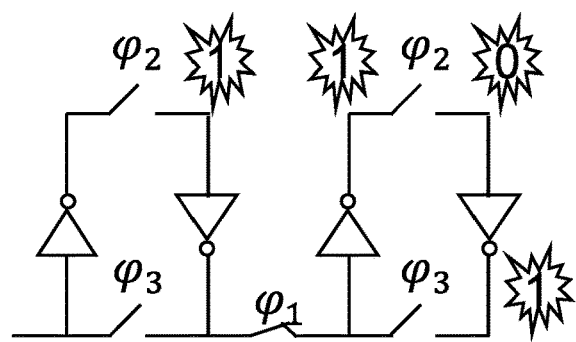
FIG. 3a is a circuit diagram illustrating various periods of a shift operation of a memory according to an embodiment of the present disclosure.
Figure 3B:
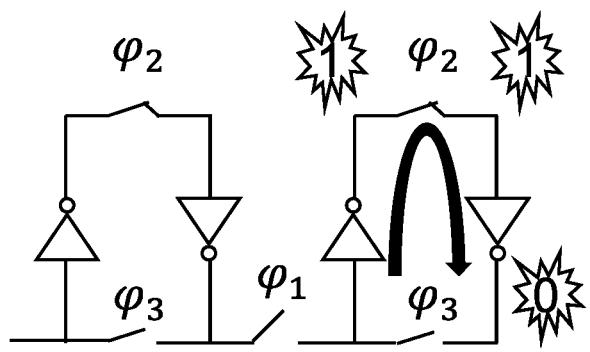
FIG. 3b is a circuit diagram illustrating various periods of a shift operation of a memory according to an embodiment of the present disclosure.
Figure 3C:
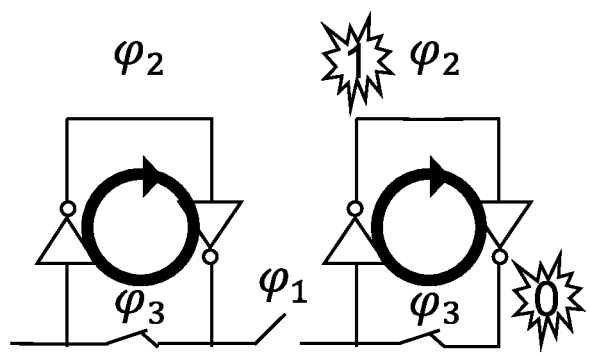
FIG. 3c is a circuit diagram illustrating various periods of a shift operation of a memory according to an embodiment of the present disclosure.

Please refer to FIGS. 3a, 3b, and 3c, which are circuit diagrams illustrating various periods of a shift operation of a memory according to an embodiment of the present disclosure.

In an embodiment, when the circuit is switched from the first mode to the second mode, it switches from the data access function to the data shifting function. In the second mode, the word-line WL can be set to a low-level state GND. The first bit-line BL and the second bit-line BLB remain unchanged. In the shift operation, the output states of the first inverter M1 and the second inverter M2 of the circuit are no longer dual. When the shift operation is finished, the output states of the first inverter M1 and the second inverter M2 can be restored to dual to enter the access mode.

In an embodiment, as shown in FIG. 3a, in the row selected for shifting (including M cascaded storage circuits), the states of the two shown storage circuits are "0" and "1" respectively.

In a possible implementation, the control module is used to operate the circuit in the second mode by the following operation:

in an embodiment, as shown in FIG. 3a, in a first shift period, the fourth switch S4 and the fifth switch S5 are controlled to be in the off state, and the first switch S1 is turned on, while the second switch S2 and the third switch S3 are turned off. In this case, the second inverter M2 of the first storage circuit (composed of M1 and M2 on the left) and the first inverter M1 of the second storage circuit (composed of M1 and M2 on the right) form a series connection. The input port of the first inverter M1 of the second storage circuit discharges to the low-level state GND (0), and the output port of the first inverter M1 charges to the high-level state VDD (1);

in an embodiment, as shown in FIG. 3b, in a second shift period, the first switch S1 is turned off, the second switch S2 is turned on, and the third switch S3 remains in the off state. In this case, the input port of the second inverter M2 connects to the output port of the first inverter M1 to form a series connection in the second storage circuit, and the output port of the second inverter M2 discharges to the low-level state GND;

in an embodiment, as shown in FIG. 3c, in a third shift period, the third switch S3 is turned on, the first switch S1 remains in the off state, and the second switch S2 remains in the on state. In this case, the first inverter M1 and the second inverter M2 of the second storage circuit reform a dual-inverter loop, and the circuit finishes the shift operation and re-enters the storage mode.

Figure 4:
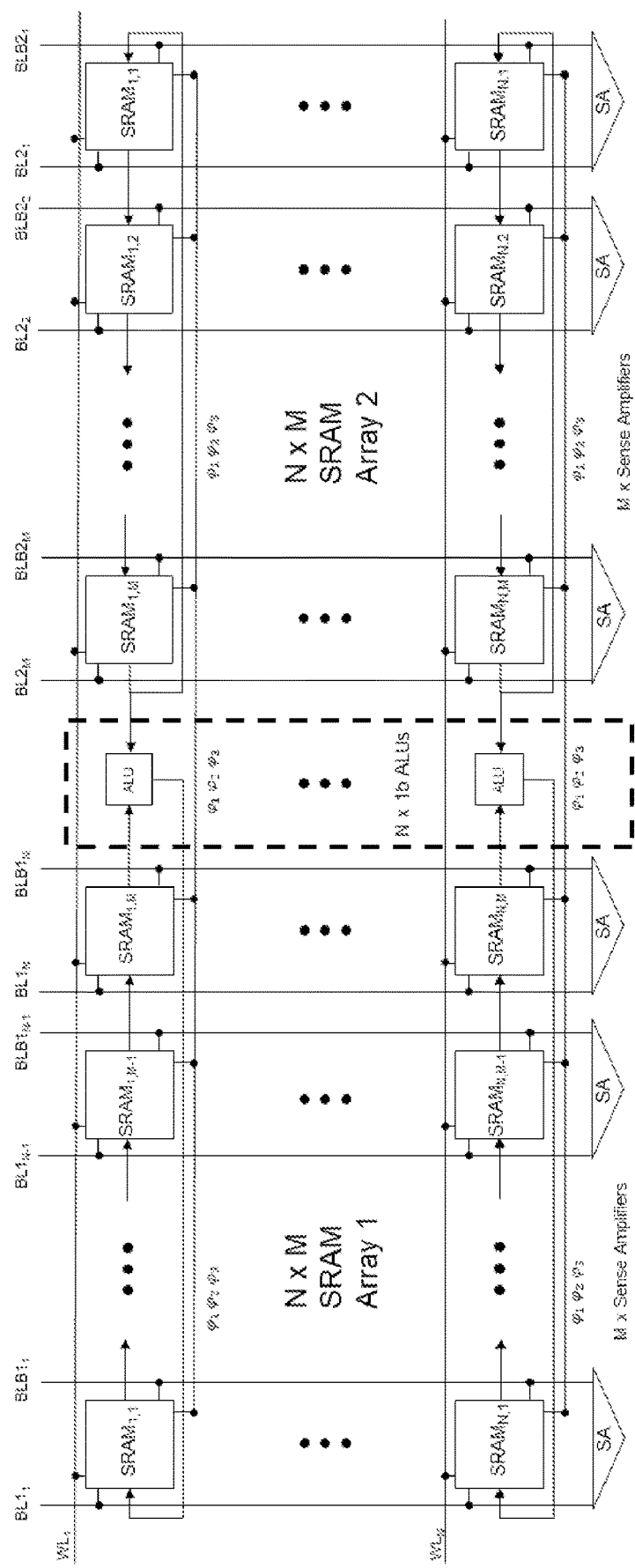
FIG. 4 is a diagram illustrating arrays of a static random-access memory according to an embodiment of the present disclosure.

Please refer to FIG. 4, which is a diagram illustrating a static random-access memory according to an embodiment of the present disclosure.

In a possible implementation, as shown in FIG. 4, the memory may include at least one storage circuit array. Each row of the storage circuit array includes M storage circuits, and each column includes N storage circuits, wherein:

the first bit-line BL (such as $BL1_1$) of multiple storage circuits in the same column (such as $SRAM_{1,1} \sim SRAM_{N,1}$) is connected, and the second bit-line BLB (such as $BLB1_1$) of multiple storage circuits in the same column is connected;

the shift-output line Sout of the k-th storage circuit of the multiple storage circuits in the same row is connected to the shift-input line Sin of the adjacent (k+1)-th storage circuit;

the word-lines WL of multiple storage circuits in the same row are connected (such as $WL_1$ of $SRAM_{1,1} \sim SRAM_{1,M}$);

the control ports of the first switches S1, the second switches S2, and the third switches S3 of multiple storage circuits in the same row are respectively connected (the first switch control signal φ1 controls the conduction state of each first switch S1, the second switch control signal φ2 controls the conduction state of each second switch S2, and the third switch control signal φ3 controls the conduction state of each third switch S3);

where k, N, and M are integers. k+1≤M.

In a possible implementation, as shown in FIG. 4, a single-bit arithmetic logic unit (ALU) is included at the end of one or more rows of storage circuits of the storage circuit array for performing multi-bit operations.

In an embodiment, as shown in FIG. 4, for an N-row memory circuit, N 1-bit arithmetic logic units can be provided to perform multi-bit operations on each row.

Figure 5A:
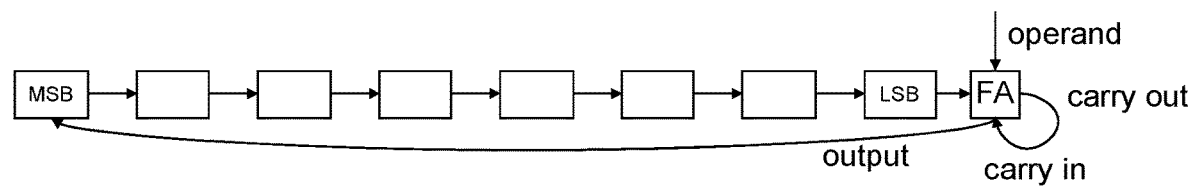
FIG. 5a is a diagram illustrating a shift operation of a storage circuit according to an embodiment of the present disclosure.
Figure 5B:
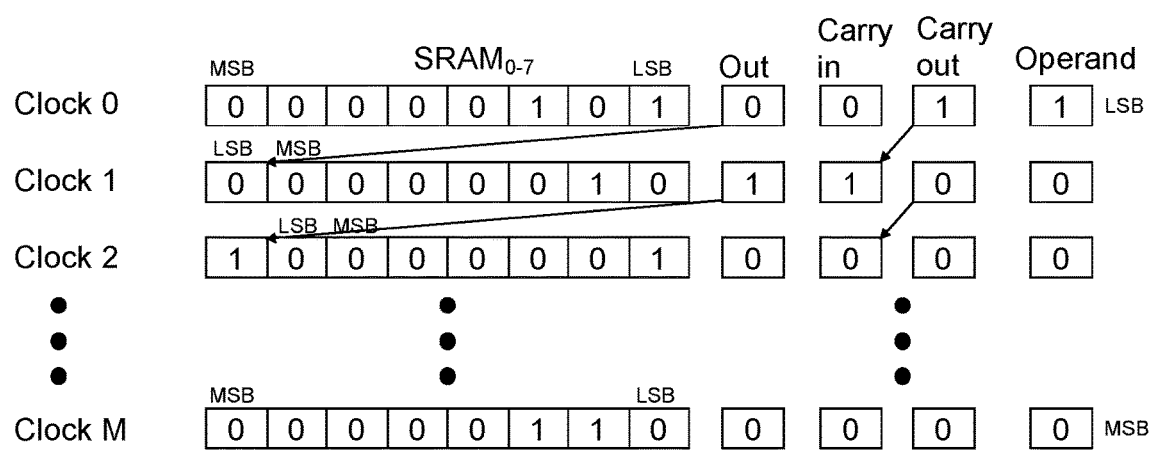
FIG. 5b is a diagram illustrating a shift operation of a storage circuit according to an embodiment of the present disclosure.

Please refer to FIGS. 5a and 5b, which are diagrams illustrating a shift operation of a storage circuit according to an embodiment of the present disclosure.

In an embodiment, as shown in FIGS. 5a and 5b, the embodiment of the present disclosure can use the shift operation of SRAM to shift the bits of each row to the right in the order from the least significant bits (LSB) to the most significant bits (MSB) and send them to the three-input single-bit arithmetic logic units (which function as full adders (FA)), whose outputs are sent back according to the cyclic shift. For example, at the time corresponding to clock 0, the LSB of the current row of the memory and the LSB of the operand perform the preset operation under the carry input to get the current output and send the current output back to the head storage circuit of the current row (the original MSB). At the same time, the stored values in each storage circuit are correspondingly shifted to the right, and the logic and shift operations are repeated (clock 1~clock M) until all bits of data in the current row and all bits of the preset operands have completed their operations.

In an embodiment, the carry input of a single-bit ALU can be the carry output of the previous clock cycle.

In an embodiment, in the second mode, the single-bit arithmetic logic unit is used for progressive operation according to the shift output of the connected storage circuit (from MSB to LSB), the corresponding bit of the preset operands, and the carry output of the previous time until each bit of the preset operands is executed once.

Figure 6A:
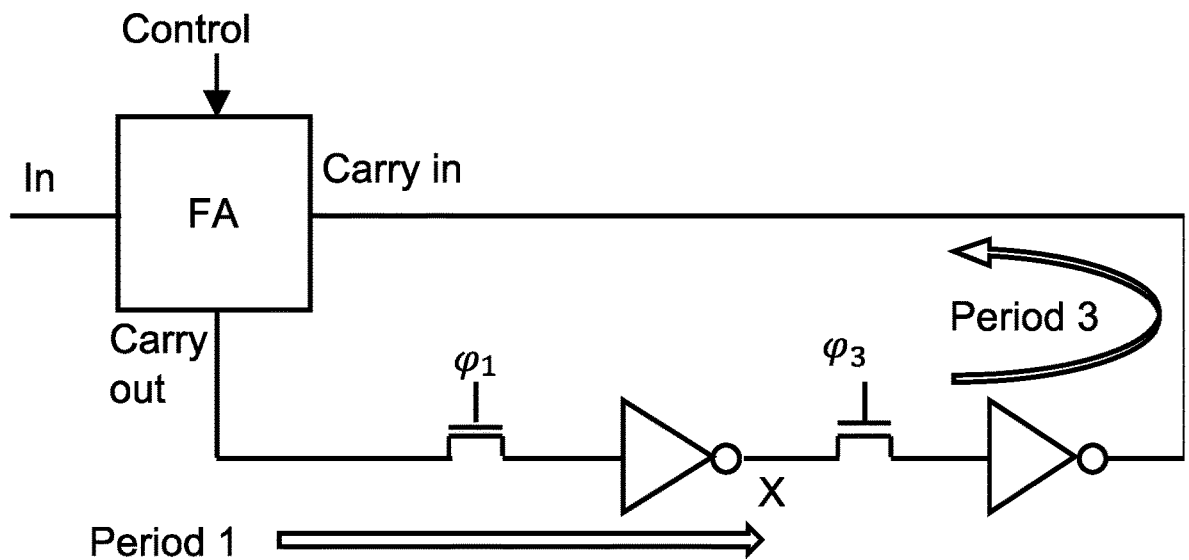
FIG. 6a is a circuit diagram illustrating a multi-bit operation according to an embodiment of the present disclosure.
Figure 6B:
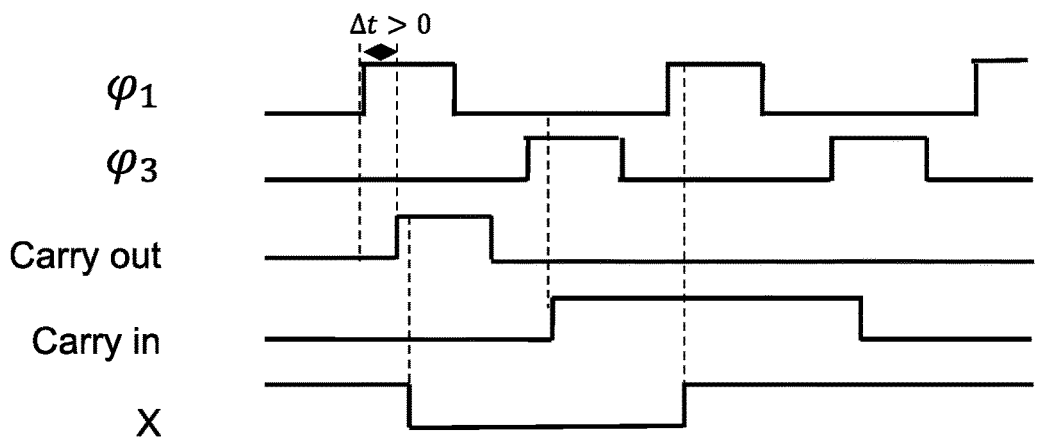
FIG. 6b is a diagram illustrating a timing of a multi-bit operation according to an embodiment of the present disclosure.

Please refer to FIGS. 6a and 6b. FIG. 6a is a circuit diagram illustrating a multi-bit operation according to an embodiment of the present disclosure. FIG. 6b is a diagram illustrating a timing of a multi-bit operation according to an embodiment of the present disclosure.

In an embodiment, as shown in FIGS. 6a and 6b, in the first shift period, the first switch S1 is turned on by the first switch control signal φ1, the third switch S3 is turned off by the third switch control signal φ3, and the carry output passes through the first inverter M1 and changes the voltage state at point X, which is dual to the actual carry output (when φ1 is high-level and φ3 is low-level, the carry output is high-level, and point X is low-level after the action of the first inverter M1);

in an embodiment, in the second shift period, the first switch S1 is turned off, the second switch S2 is turned on, and the third switch S3 remains in the off state. In this case, the voltage states of the carry output and point X are maintained (when φ1 is low-level and φ3 is low-level, the carry output is high-level and point X is low-level);

in an embodiment, in the third shift period, the third switch S3 is turned on, and the first switch S1 remains in the off state, and the voltage state of point X passes through the second inverter M2 and changes the voltage state of the carry input (when φ1 is low-level and φ3 is high-level, the carry input jumps to high-level after the action of the second inverter M2, and point X is low-level). In an embodiment, after a shift operation is completed, the status of the carry input is the carry output of the current calculation by the full adder and is used as the carry input in the next calculation of the full adder.

In a possible implementation, the preset operation includes any one of a logical NOT operation, a logical AND operation, and a logical OR operation;

the single-bit arithmetic logic unit is a Mealy machine;

the preset operation bit comes from an external device or another memory connected with the memory;

when performing multi-bit operations, the single-bit arithmetic logic unit performs operations from the least significant bit to the most significant bit of the preset operands. The output of the single-bit arithmetic logic unit is used as the shift input of the front of the current row.

In an embodiment, the update operation of the array circuit can be carried out in parallel. The switch control signals of each row can be given simultaneously so that each row can be shifted simultaneously.

In an embodiment, when performing an additive update operation on the first array circuit, one or more rows can be controlled to operate simultaneously, and the bits of the preset operands can be from the shift outputs of the second array circuit.

In an embodiment, as shown in FIG. 4, the memory of the embodiment includes embodiments of the first array 1 and the second array 2. The array size of the first array 1 and the second array 2 can be both N rows by M columns. Each row stores an integer of M bits and implements the additive update operation of array 1=array 1+array 2.

In an embodiment, the additive update operation can be completed in M steps, and each step can include three stages:

in the first shift period, the fourth switch S4 and the fifth switch S5 are controlled to be in the off state, and the first switch S1 is turned on through a first switch control line φ1, while the second switch S2 and the third switch S3 are turned off through a second switch control line φ2 and a third switch control line φ3 respectively. Thus the loop formed by the two inverters in the storage circuit is opened and the second inverter M2 of the current storage circuit is connected with the first inverter M1 of the following adjacent storage circuit;

in the second shift period, the first switch S1 is turned off through the first switch control line φ1, the second switch S2 is turned on through the second switch control line φ2, and the third switch S3 remains in the off state through the third switch control line φ3. Thus the input port of the second inverter M2 of the storage circuit is connected with the output port of the first inverter M1 of the storage circuit;

in the third shift period, the first switch S1 remains in the off state, the second switch S2 remains in the on state, and the third switch S3 is turned on through the first switch control line φ1, the second switch control line φ2 and the third switch control line φ3 respectively. Thus the dual-inverter loop is formed by the first inverter M1 and the second inverter M2, and a shift operation is completed. Meanwhile, in the single-bit arithmetic logic unit, the M-th column of each row in the first array 1 and the M-th column of each row in the second array 2 are added, and the result is updated to the first column of the first array 1. Therefore, after the M-step operation, the values stored in the second array 2 are added to the values stored in the first array 1.

Of course, the above is an exemplary description of updating the data in the first array 1 according to the data in the second array 2, and the present disclosure is not limited thereby. The operands for updating the data in the first array 1 can be from other arrays in the present memory (such as the second array 2), other memories connected with the present memory, or other devices connected with the present memory, and no limitation is made in this respect in the embodiment of the present disclosure.

The embodiment takes the corresponding bits of the shift outputs of the cascaded storage circuits in the storage circuit array from low bits to high bits, and calculates the result with the single-bit arithmetic logic unit. Then the result is shifted input from high bits to low bits. Thus the embodiment could achieve high parallel update and reduce energy consumption.

It should be understood that each storage circuit array in the embodiment of the present disclosure could be controlled synchronously or separately, and each array could operate in the access mode or the shift mode synchronously or separately. Wherein, in the access mode, the first switch control line φ1 could be set up as the low-level state GND, the second switch control line φ2 and the third switch control line φ3 could be set up as VDD; in the shift mode, the switches could be controlled according to the above operation steps.

Figure 7:
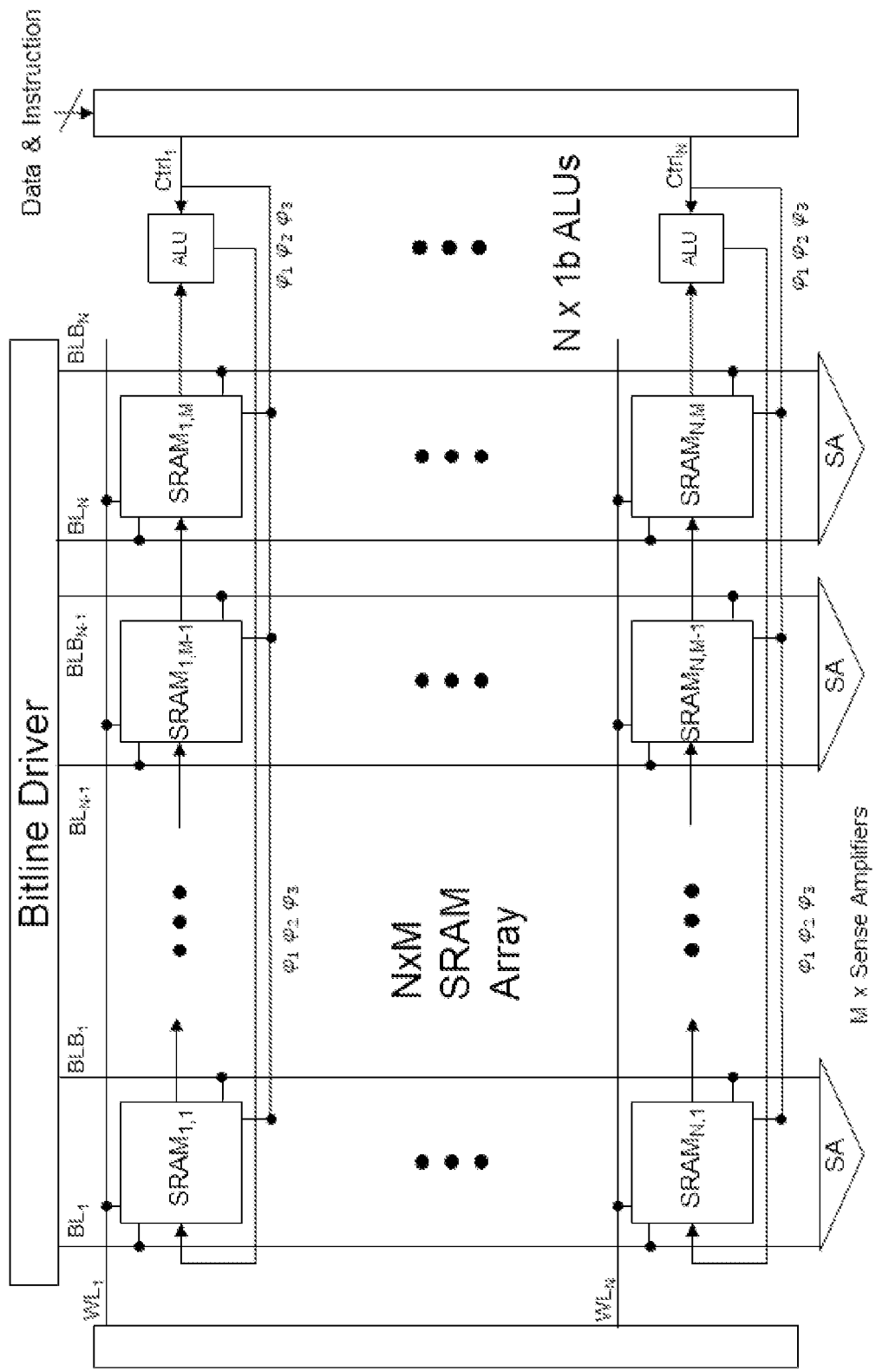
FIG. 7 is a diagram illustrating a structure of a static random-access memory according to an embodiment of the present disclosure.

Please refer to FIG. 7, which is a diagram illustrating a structure of a static random-access memory according to an embodiment of the present disclosure.

In a possible implementation, as shown in FIG. 7, the control module can also include a bit-line driver, a word-line driver, a control decoder, and other devices. The bit-line driver controls the states of the first bit-line BL and the second bit-line BLB to select the storage circuits of the corresponding column in the memory; the word-line driver controls the state of the word-line WL to select the storage circuits of the corresponding row in the memory, so as to write data to the storage circuits. The control decoder receives external data and instructions, by which it could control the state of each switch and provide the operands when updating the data of the array circuits.

The instructions and data in the embodiment of the present disclosure can be provided by the control module, an external circuit, or other storage circuit arrays in the memory. No limitation is made in this respect in the embodiment of the present disclosure.

Figure 8:
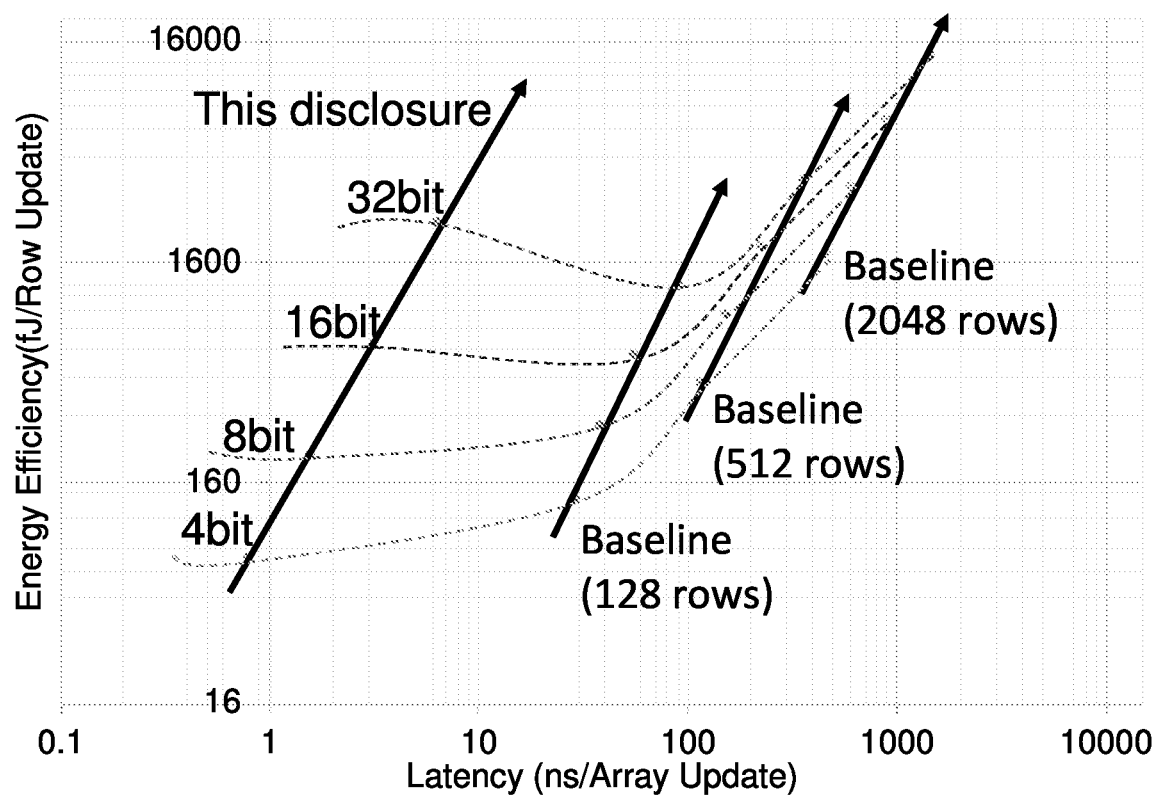
FIG. 8 is an effect diagram illustrating a static random-access memory according to an embodiment of the present disclosure and a memory in a related technique.

Please refer to FIG. 8, which is an effect diagram illustrating a static random-access memory according to an embodiment of the present disclosure and a memory in a related technique.

In an embodiment, as shown in FIG. 8, when the static random-access memory of the embodiment of the present disclosure performs high concurrent accesses and calculations, the energy consumption of the circuit array primarily attributes to charging the bit-lines/word-lines. Compared with the read-modify-write strategy of SRAM of related technologies, when the number of bits in data stored in the array is less than the number of data stored, the length of the bit-lines/word-lines needed to be charged and discharged in the embodiment is shorter. Thus the power consumption of memory accesses can be reduced significantly. At the same time, because the entire array can be updated simultaneously, the latency of updating the stored data could also be markedly reduced in the embodiment.

In the embodiment of the present disclosure, the memory can include a circuit array composed of a plurality of storage circuits. Storage circuits are combined to an array with several rows and columns by electrical connections, where each row can be shifted independently or simultaneously, which has the advantages of high concurrency and low power consumption. Thus the embodiment can greatly improve the update concurrency and reduce the power consumption.

The in-memory computing implemented by the memory proposed in the embodiment of the present disclosure has the advantages of high integration, low power consumption, and high parallelism. It can be used in many applications, such as the acceleration of neural network training and inference, and the acceleration of database caching.

The memory proposed in the embodiment of the present disclosure can be applied to various electronic devices, and the following is an example introduction to the electronic devices.

Figure 9:
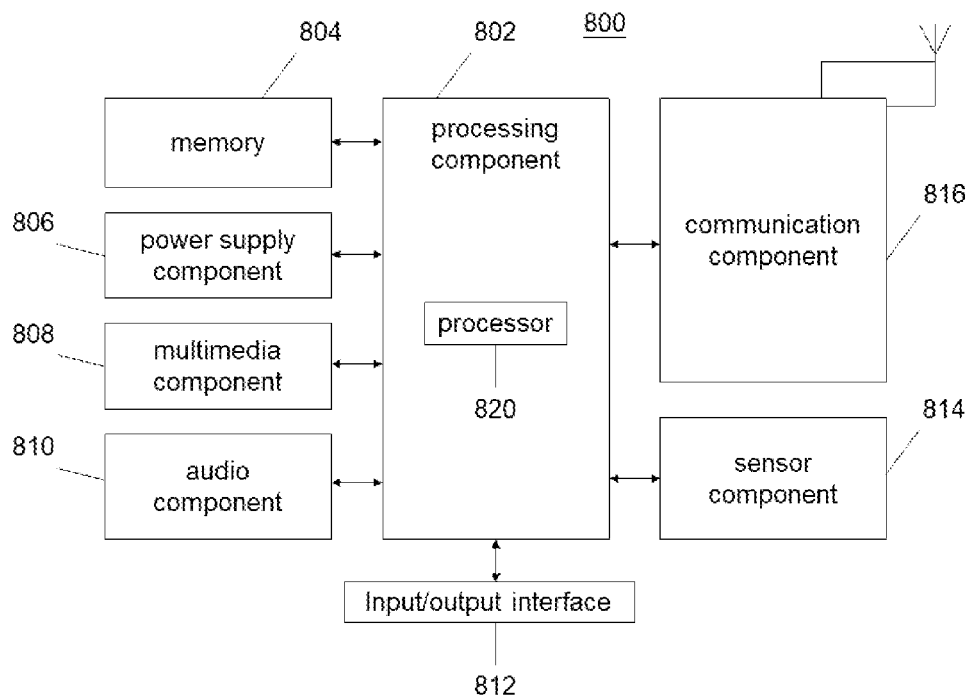
FIG. 9 is a block diagram illustrating an electronic device according to an embodiment of the present disclosure.

Please refer to FIG. 9, which is a block diagram illustrating an electronic device according to an embodiment of the present disclosure.

For example, the device 800 may be a mobile phone, a computer, a digital broadcasting terminal, a message transceiving device, a game console, a tablet device, a medical device, a fitness device, a personal digital assistant, etc.

Referring to FIG. 9, the device 800 may include one or more of the following components: a processing component 802, a memory 804, a power supply component 806, a multimedia component 808, an audio component 810, an input/output (I/O) interface 812, a sensor component 814, and a communication component 816.

The processing component 802 typically controls the overall operation of the device 800, such as operations associated with display, telephone call, data communication, camera operation, and recording operation. The processing component 802 may include one or more processors 820 to execute instructions to complete all or part of the steps of the methods described above. In addition, the processing component 802 may include one or more modules to facilitate interaction between the processing component 802 and other components. For example, the processing component 802 may include a multimedia module to facilitate interaction between the multimedia component 808 and the processing component 802.

The memory 804 is configured to store various types of data to support operation on the device 800. Examples of these data include instructions for any application or method operated on the device 800, contact data, phonebook data, messages, pictures, videos, etc. The memory 804 can be implemented by any type of volatile or nonvolatile memory device or the combination thereof, such as a static random-access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or an optical disk, etc.

The power supply component 806 supplies electric power to various components of the device 800. The power supply component 806 may include a power management system, one or more power supplies, and other components related to the generation, management, and distribution of electric power of the device 800.

The multimedia component 808 includes a screen providing an output interface between the device 800 and the user. In some embodiments, the screen may include a liquid crystal display (LCD) and a touch panel (TP). If the screen includes a touch panel, the screen may be implemented as a touch screen to receive input signals from the user. The touch panel includes one or more touch sensors to sense touch, slide, and gestures on the touch panel. The touch sensor can not only sense boundaries of the touch or slide action, but also can detect the duration and pressure related to the touch or slide operation. In some embodiments, the multimedia component 808 includes a front-facing camera and/or a rear camera. When the device 800 is in an operation mode, such as a photo capturing mode or a video mode, the front-facing camera and/or the rear camera may receive external multimedia data. Each front-facing camera and rear camera can be a fixed optical lens system or have focal length and optical zoom capability.

The audio component 810 is configured to output and/or input audio signals. For example, the audio component 810 includes a microphone (MIC), which can be configured to receive external audio signals when the device 800 is in an operation mode, such as a calling mode, a recording mode, and a speech recognition mode. The received audio signal may be further stored in memory 804 or transmitted via communication component 816. In some embodiments, the audio component 810 also includes a speaker for outputting an audio signal.

The audio component 810 is configured to output and/or input audio signals. For example, the audio component 810 includes a microphone (MIC) configured to receive external audio signals when the device 800 is in an operation mode such as a call mode, a recording mode, and a speech recognition mode. The received audio signals may be further stored in the memory 804 or transmitted via the communication component 816. In some embodiments, the audio component 810 also includes a speaker for audio signal output.

The I/O interface 812 provides an interface between the processing component 802 and peripheral interface modules, which can be keyboards, click wheels, buttons, etc. These buttons may include but are not limited to: a home button, a volume button, a start button, and a lock button.

The sensor component 814 includes one or more sensors for assessing various aspects of the condition of the device 800. For example, the sensor component 814 can detect the on/off state of the device 800 and the relative positioning of the components. For example, the components are the display and the keyboard of the device 800. The sensor component 814 can also detect the changes in position of the device 800 or one component of the device 800, presence or absence of the user's contact with the device 800, the orientation or acceleration/deceleration of the device 800, and the temperature change of the device 800. The sensor component 814 may include a proximity sensor configured to detect the presence of a nearby object without any physical contact. The sensor component 814 may also include an optical sensor, such as a CMOS or a CCD image sensor, for use in imaging applications. In some embodiments, the sensor component 814 may further include an acceleration sensor, a gyroscope sensor, a magnetic sensor, a pressure sensor, or a temperature sensor.

The communication component 816 is configured to facilitate wired or wireless communication between the device 800 and other devices. The device 800 may connect to a wireless network based on a communication standard, such as Wi-Fi, 2G or 3G, or a combination thereof. In an exemplary embodiment, the communication component 816 receives broadcast signals or broadcast-related information from an external broadcast management system via a broadcast channel. In an exemplary embodiment, the communication component 816 also includes a near-field communication (NFC) module to facilitate short-range communication. For example, the NFC module can be implemented based on a radio frequency identification (RFID) technology, an infrared data association (IrDA) technology, an ultra-wideband (UWB) technology, a Bluetooth (BT) technology, and other technologies.

In an exemplary embodiment, the device 800 may be implemented by one or more application-specific integrated circuits (ASICs), digital signal processors (DSPs), digital signal processing devices (DSPDs), programmable logic devices (PLDs), field-programmable gate arrays (FPGAs), controllers, microcontrollers, microprocessors, or other electronic elements for performing the above methods.

While various embodiments of the present disclosure have been described above, it should be understood that the descriptions are exemplary but not exhaustive, and the present disclosure is not limited to the disclosed embodiments. Without departing from the scope and spirit of the described embodiments, many modifications and changes are obvious to those of ordinary skill in the art. The selection of terms used herein is intended to best explain the principles of the embodiments, practical applications, improvements over technologies found in the marketplace, or to enable other ordinary technicians in the art to understand the embodiments disclosed.

What is claimed is:

1. A static random-access memory comprising at least: one storage circuit comprising a first inverter, a second inverter, a first switch, a second switch, a third switch, a fourth switch, a fifth switch, a word-line, a first bit-line, a second bit-line, a shift-input line, and a shift-output line, wherein:

the first switch is used to control the connection between the shift-input line and the input port of the first inverter;

the second switch is used to control the connection between the output port of the first inverter and the input port of the second inverter; the third switch is used to control the connection between the input port of the first inverter and the output port of the second inverter;

the fourth switch and the fifth switch are used to control the connection between the first bit-line and the input port of the first inverter, and the connection between the second bit-line and the input port of the second inverter, respectively according to the input of the word-line, wherein, when the circuit works in a first mode, the circuit is used to access data using the first bit-line and/or the second bit-line; or, when the circuit works in a second mode, the circuit is used to shift the input data to the shift-input line and output the shifted data through the shift-output line.

2. The memory of claim 1, wherein the circuit works in the first mode when the first switch is off, while the fourth switch and the fifth switch are on.

3. The memory of claim 2, wherein the circuit is used to store data when the second switch and the third switch are on.

4. The memory of claim 2, wherein the circuit is used to write data according to the state(s) of the first bit-line and/or the second bit-line when the second switch and the third switch are off.

5. The memory of claim 1, further comprising:

a control module connected to the first switch, the second switch, the third switch, the first bit-line, the second bit-line and the word-line for controlling the conduction states of the first switch, the second switch and the third switch, and the states of the first bit-line, the second bit-line, and the word-line, thus operating the circuit in the first mode or the second mode.

6. The memory of claim 5, wherein the control module is used to operate the circuit in the first mode for data writing by the following operations:

in a first writing period, the first switch is controlled to be in the off state, and the first bit-line and the second bit-line are configured in a high-level state or a low-level state according to the data to be written;

in a second writing period, the word-line is configured in a high-level state to turn on the fourth switch and the fifth switch, and turn off the second switch and the third switch;

in a third writing period, the word-line is configured in a low-level state to turn off the fourth switch and the fifth switch, and sequentially turn on the second switch and the third switch.

7. The memory of claim 5, wherein the control module is used to operate the circuit in the second mode for data shifting by the following operations:

in a first shift period, the fourth switch and the fifth switch are controlled to be in the off state, and the first switch is on, while the second switch and the third switch are off;

in a second shift period, the first switch is turned off, the second switch is turned on, and the third switch remains in the off state;

in a third shift period, the third switch is turned on, the first switch remains in the off state, and the second switch remains in the on state.

8. The memory of claim 1, further comprising at least one storage circuit array, wherein each row of the storage circuit array comprises M cells, and each column comprises N cells; and the first bit-lines of multiple storage circuits in the same column are connected, and the second bit-lines of multiple storage circuits in the same column are connected;

the shift-output line of the k-th memory circuit of the multiple storage circuits in the same row is connected to the shift-input line of the adjacent (k+1)-th storage circuit;

the word-lines of multiple storage circuits in the same row are connected;

the control ports of the first switches, the second switches, and the third switches of multiple storage circuits in the same row are respectively connected;

wherein k, N, and M are integers, k+1≤M.

9. The memory of claim 8, wherein a single-bit arithmetic logic unit is comprised at the end of one or more rows of storage circuits of the storage circuit array for performing multi-bit operations, wherein in the second mode, the single-bit arithmetic logic unit is used for progressive operation according to the shift output of the connected storage circuit, the corresponding bit of the preset operands, and a carry output of a previous time, until each bit of the preset operands is executed once.

10. The memory of claim 9, wherein:

the preset operation comprises any one of a logical NOT operation, a logical AND operation, and a logical OR operation, the preset operation bit comes from an external device or another memory connected with the memory, the output of the single-bit arithmetic logic unit is used as the shift input of the front of the current row.

11. An electronic device, wherein the electronic device comprises at least one static random access memory comprising at least: one storage circuit comprising a first inverter, a second inverter, a first switch, a second switch, a third switch, a fourth switch, a fifth switch, a word-line, a first bit-line, a second bit-line, a shift-input line, and a shift-output line, wherein:

the first switch is used to control the connection between the shift-input line and the input port of the first inverter;

the second switch is used to control the connection between the output port of the first inverter and the input port of the second inverter; the third switch is used to control the connection between the input port of the first inverter and the output port of the second inverter;

the fourth switch and the fifth switch are used to control the connection between the first bit-line and the input port of the first inverter, and the connection between the second bit-line and the input port of the second inverter, respectively according to the input of the word-line, wherein, when the circuit works in a first mode, the circuit is used to access data using the first bit-line and/or the second bit-line; or, when the circuit works in a second mode, the circuit is used to shift the input data to the shift-input line and output the shifted data through the shift-output line.

12. The electronic device of claim 11 wherein the circuit works in the first mode when the first switch is off, while the fourth switch and the fifth switch are on.

13. The electronic device of claim 12, wherein the circuit is used to store data when the second switch and the third switch are on.

14. The electronic device of claim 12, wherein the circuit is used to write data according to the state(s) of the first bit-line and/or the second bit-line when the second switch and the third switch are off.

15. The electronic device of claim 11, wherein the memory further comprises:

a control module connected to the first switch, the second switch, the third switch, the first bit-line, the second bit-line and the word-line for controlling the conduction states of the first switch, the second switch and the third switch, and the states of the first bit-line, the second bit-line, and the word-line, thus operating the circuit in the first mode or the second mode.

16. The electronic device of claim 15, wherein the control module is used to operate the circuit in the first mode for data writing by the following operations:

in a first writing period, the first switch is controlled to be in the off state, and the first bit-line and the second bit-line are configured in a high-level state or a low-level state according to the data to be written;

in a second writing period, the word-line is configured in a high-level state to turn on the fourth switch and the fifth switch, and turn off the second switch and the third switch;

in a third writing period, the word-line is configured in a low-level state to turn off the fourth switch and the fifth switch, and sequentially turn on the second switch and the third switch.

17. The electronic device of claim 15, wherein the control module is used to operate the circuit in the second mode for data shifting by the following operations:

in a first shift period, the fourth switch and the fifth switch are controlled to be in the off state, and the first switch is on, while the second switch and the third switch are off;

in a second shift period, the first switch is turned off, the second switch is turned on, and the third switch remains in the off state;

in a third shift period, the third switch is turned on, the first switch remains in the off state, and the second switch remains in the on state.

18. The electronic device of claim 11, wherein the memory further comprises at least one storage circuit array, wherein each row of the storage circuit array comprises M cells, and each column comprises N cells; and the first bit-lines of multiple storage circuits in the same column are connected, and the second bit-lines of multiple storage circuits in the same column are connected;

the shift-output line of the k-th memory circuit of the multiple storage circuits in the same row is connected to the shift-input line of the adjacent (k+1)-th storage circuit;

the word-lines of multiple storage circuits in the same row are connected;

the control ports of the first switches, the second switches, and the third switches of multiple storage circuits in the same row are respectively connected;

wherein k, N, and M are integers, k+1≤M.

19. The electronic device of claim 18, wherein a single-bit arithmetic logic unit is comprised at the end of one or more rows of storage circuits of the storage circuit array for performing multi-bit operations, wherein in the second mode, the single-bit arithmetic logic unit is used for progressive operation according to the shift output of the connected storage circuit, the corresponding bit of the preset operands, and a carry output of a previous time, until each bit of the preset operands is executed once.

20. The electronic device of claim 19, wherein:

the preset operation comprises any one of a logical NOT operation, a logical AND operation, and a logical OR operation, the preset operation bit comes from an external device or another memory connected with the memory, the output of the single-bit arithmetic logic unit is used as the shift input of the front of the current row.

* * * * *